(12) United States Patent
Bromberger

(10) Patent No.: US 7,605,450 B2
(45) Date of Patent: Oct. 20, 2009

(54) HIGH FREQUENCY ARRANGEMENT

(75) Inventor: Christoph Bromberger, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 340 days.

(21) Appl. No.: 11/359,544

(22) Filed: Feb. 23, 2006

(65) Prior Publication Data
US 2006/0186532 A1 Aug. 24, 2006

(30) Foreign Application Priority Data
Feb. 23, 2005 (DE) .................. 10 2005 008 195

(51) Int. Cl.
*H01L 23/12* (2006.01)
(52) U.S. Cl. .............. 257/664; 257/E23.057; 257/728
(58) Field of Classification Search .......... 257/728, 257/E23.057, 664
See application file for complete search history.

(56) References Cited

U.S. PATENT DOCUMENTS

| | | | |
|---|---|---|---|
| 5,338,950 A * | 8/1994 | Bahl | 257/277 |
| 5,534,727 A | 7/1996 | Inoue | |
| 6,107,684 A | 8/2000 | Busking et al. | |
| 7,053,435 B2 * | 5/2006 | Yeo et al. | 257/309 |
| 7,242,153 B2 * | 7/2007 | Yu et al. | 315/291 |
| 2002/0142512 A1 * | 10/2002 | Ma et al. | 438/100 |
| 2003/0030589 A1 * | 2/2003 | Zurcher et al. | 343/718 |
| 2003/0160274 A1 * | 8/2003 | Das et al. | 257/306 |

FOREIGN PATENT DOCUMENTS

| | | |
|---|---|---|
| EP | 0 930 653 A1 | 7/1999 |
| EP | 0 969 509 A1 | 1/2000 |
| EP | 1 182 703 A2 | 2/2002 |
| JP | 4-61244 A | 2/1992 |
| JP | 4-107940 A | 4/1992 |
| WO | WO 98/13873 | 4/1998 |

* cited by examiner

*Primary Examiner*—Evan Pert
*Assistant Examiner*—Krista Soderholm
(74) *Attorney, Agent, or Firm*—Muncy, Geissler, Olds & Lowe, PLLC

(57) ABSTRACT

A high frequency arrangement is provided that includes an integrated high frequency circuit, a first bond pad, which is electrically connected by a first electrical supply line, in particular a bond wire and/or a solder bump, to a housing terminal and/or another circuit, wherein the first bond pad adjoins a dielectric so that the first bond pad forms a first capacitance with the dielectric and an electrically conductive region of the integrated high-frequency circuit, and the first capacitance and the first supply line, which has an inductance, influence a (tuned) first resonant frequency associated with the high-frequency circuit.

12 Claims, 2 Drawing Sheets

HIGH FREQUENCY ARRANGEMENT

This nonprovisional application claims priority under 35 U.S.C. § 119(a) on German Patent Application No. 102005008195, which was filed in Germany on Feb. 23, 2005, and which is herein incorporated by reference.

BACKGROUND OF THE INVENTION

1. Field of the Invention

The present invention relates to a high frequency arrangement.

2. Description of the Background Art

As the operating frequency of high frequency circuits increases, the assembly technology, which is to say the electrical and mechanical connection of a semiconductor chip to its housing and terminals or to other semiconductor chips, has an increasing influence on the functionality of the high-frequency circuit. The electrical and mechanical connections create parasitic inductances and capacitances that can degrade the electrical properties of the high frequency circuit.

One possible reason for this degradation is the inductances of the supply lines, such as bond wires or solder bumps or the like, which are needed to connect to the high-frequency circuit.

One conventional solution for this problem is the use of what is known as a "virtual ground." For example, instead of what is called a "single-ended" (non-symmetrical) amplifier arrangement, a differential amplifier design is used in which the symmetry point of the amplifier circuit experiences no voltage fluctuations. Accordingly, when the amplifier circuit is powered from the symmetry point, a suitable circuit design makes it possible to ignore supply line inductances.

Associated with the symmetrical solution is the necessity to drive loads symmetrically or to make the initially differential output signal asymmetrical. The measurement effort for measuring the electrical characteristic quantities must be matched to the differential system. The complexity of symmetrical systems is greater as compared to non-symmetrical systems.

SUMMARY OF THE INVENTION

It is therefore an object of the present invention to reduce the influence of inductances of supply lines to a high frequency circuit on its electrical characteristics as much as possible.

Accordingly, a high frequency arrangement is provided such as is used for a region above 1 GHz. The high frequency arrangement has a high frequency circuit on a semiconductor chip and an electrical supply line. The electrical supply line to the semiconductor chip connects the high-frequency circuit to a housing terminal and/or another circuit. In this regard, the electrical supply line has an inductance that may be parasitic. The supply line to the semiconductor chip is a bond wire and/or a solder bump, for example.

In an embodiment of the present invention, a series-resonant circuit can be connected in parallel to the electrical supply line. In particular, the series-resonant circuit is damped, because this series-resonant circuit itself has a (real) resistive component. The series-resonant circuit has a resonant frequency that is matched to a requirement of the high frequency circuit in this context. An embodiment of the invention provides that the series-resonant circuit can be composed of a supply line acting as an inductance and a bond pad having a capacitance.

Another embodiment of the invention provides a high frequency arrangement with an integrated high frequency circuit, a first bond pad, and a first electrical supply line. Here, the bond pad is electrically connected by the first electrical supply line, in particular a bond wire and/or solder bump, to a housing terminal and/or another circuit. In this regard, a variety of housing types, such as, for example, surface-mounted packages (SMD) or flip-chip housings, can be used as the housing.

The first bond pad adjoins a dielectric. In this regard, the first bond pad forms a first capacitance with the dielectric and an electrically conductive region of the integrated high-frequency circuit. The capacitance depends on the thickness of the dielectric and the geometry of the bond pad as well as on their tolerances.

The first capacitance and the first supply line, which has an inductance, influence a first resonant frequency, which is associated with the high-frequency circuit. This resonant frequency is preferably tuned to an operating frequency of the high-frequency circuit within the scope of typical manufacturing tolerances.

In a further embodiment of the invention, a second bond pad can be conductively connected to the electrically conductive region, so that a significant DC current can flow through the second bond pad between the bond pad and the high-frequency circuit. The second bond pad can be electrically connected to the housing terminal and/or the additional circuit by a second supply line for connection in parallel with the first bond pad and with the first supply line.

In yet a further embodiment of the invention, a third bond pad can be provided that is electrically connected to the housing terminal and/or the additional circuit by a third supply line for connection in parallel, especially to compensate for production tolerances on the geometry of the first bond pad and a thickness of the dielectric. Preferably the third bond pad can be located adjacent to the first bond pad or the second bond pad.

In this context, the third bond pad adjoins a dielectric. This dielectric preferably has the same material composition and, within the scope of the manufacturing tolerance, the same material thickness as the dielectric that adjoins the first bond pad. Alternatively, different dielectrics may also be used. The third bond pad forms a second capacitance with the dielectric and the electrically conductive region of the integrated high-frequency circuit. In this context, the second capacitance and the second supply line, which has an inductance, influence a second resonant frequency associated with the high-frequency circuit. This second resonant frequency is preferably different from the first resonant frequency and differs therefrom by less than 10%, especially preferably by less than 5%.

Additional parallel circuits, comprised of additional lines and additional bond pads adjoining dielectrics, influence additional resonant frequencies. The number of parallel circuits depends advantageously on the manufacturing tolerance of the geometry of the bond pads and the thickness of the dielectric. The parallel-connected individual resonant circuits also produce coupled resonances formed by the interconnection of the individual resonant circuits among one another.

A further embodiment of the invention provides for the first capacitance to differ from the second capacitance by virtue of a different geometry, for example, by a different surface area. If a number of supply lines are connected in parallel to one another, each capacitance can have a different geometry from any other capacitance of a series-resonant circuit, so that the individual resonant circuits are detuned relative to one another.

The conductive region can be conductively connected to a semiconductor region of an active, integrated component of the integrated high-frequency circuit. The semiconductor region is, for example, a drain region of a high-frequency field-effect transistor. The semiconductor region can be an emitter of a high-frequency bipolar transistor or of a high-frequency tetrode, which is conductively connected to the conductive region, for example through a metal area or a junction or boundary surface between different dopant concentrations.

The high-frequency circuit can be designed such that at least the second line forms a negative electrical feedback, in particular a negative current feedback, for the integrated high-frequency circuit, which can be reduced for at least the first resonant frequency by the parallel connection with the first bond pad and the first line.

In a further embodiment of the invention, provision is made that the dielectric has silicon dioxide and preferably has a thickness less than 100 nm, but especially preferably a thickness of 50 nm.

While it is possible for the conductive region adjoining the dielectric to have a doped semiconductor, according to an embodiment of the invention the conductive region has a metal. For example, the conductive region includes aluminum or a silicide.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 2:
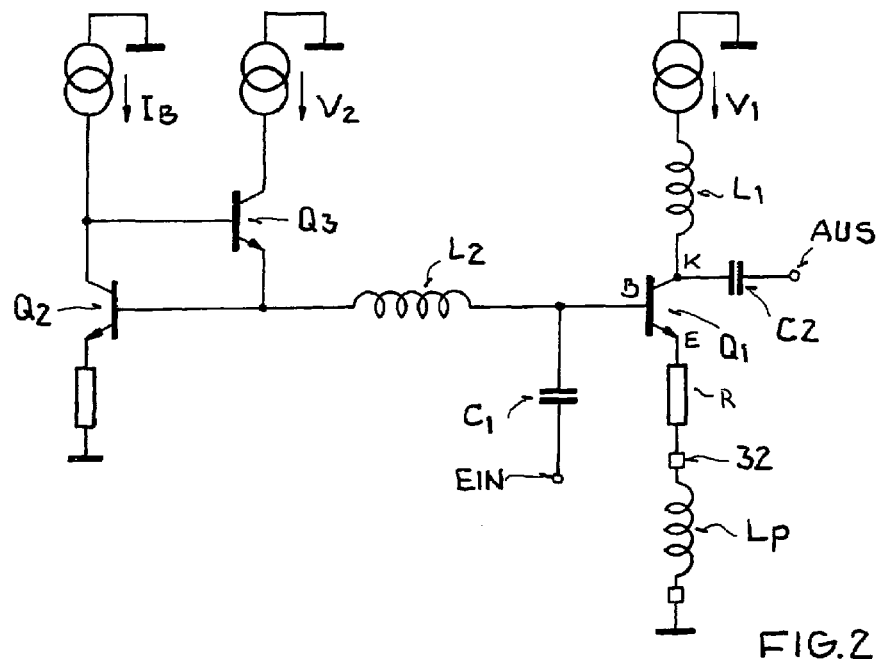
FIG. 2 is a circuit diagram for a high frequency amplifier.

First, for FIG. 2, an achievable power gain of an output driver for 5 GHz in SiGe technology is examined. In this context, the output driver is a SiGe npn heterobipolar transistor Q1 with an emitter size of 20×1 $\mu m^2$ per emitter finger and a number NE of emitter fingers, hereinafter referred to as "finger count," in a common-emitter circuit. A supply line (Lp) required for electrically contacting the emitter E can scarcely be implemented with a reactive component Lp of less than 0.1 nH, regardless of whether it is in the form of solder bumps or bond wires.

A parallel connection of a number n of inductances Lp of a given inductance which are not coupled to one another has an overall inductance on the order of the individual inductance divided by the factor n. Conversely, each of NE emitter fingers connected overall to an inductance of 0.1 nH experiences an effective inductance of NE times 0.1 nH.

However, an inductance Lp in the emitter branch represents a negative feedback and reduces the achievable gain (G). In the case under consideration, above a finger count of approximately 16 and a frequency of approximately 1 GHz, the power gain G drops by 3 dB when the finger count is doubled. The circuit in FIG. 2 with NE=128 emitter fingers serves as an example.

In this context, the high-frequency signal is fed into the circuit for amplification through the input EIN. The input EIN is DC decoupled from the base B of the transistor Q1 by a capacitor C1. The components—current source IB, voltage source V2, transistors Q2 and Q3, and the inductance L2—serve to set the operating point of the high-frequency transistor Q1.

The collector K of the high-frequency transistor Q1 is connected to the output AUS of the circuit and DC decoupled by an additional capacitor C2. In addition, the collector K of the high-frequency transistor Q1 is, in turn, connected to an additional inductance L1 and a voltage source V1 for setting the operating point and is HF decoupled.

The emitter E of the high-frequency transistor Q1 has a real resistive component, which is indicated as a resistor R. The emitter E of the high-frequency transistor Q1 is connected to a bond pad 32, which is schematically represented in the circuit diagram of FIG. 2 as a rectangle. The bond pad 32 is connected to a terminal of the housing of the high-frequency arrangement by a supply line formed of a bond wire, which forms a parasitic inductance Lp.

Figure 1:
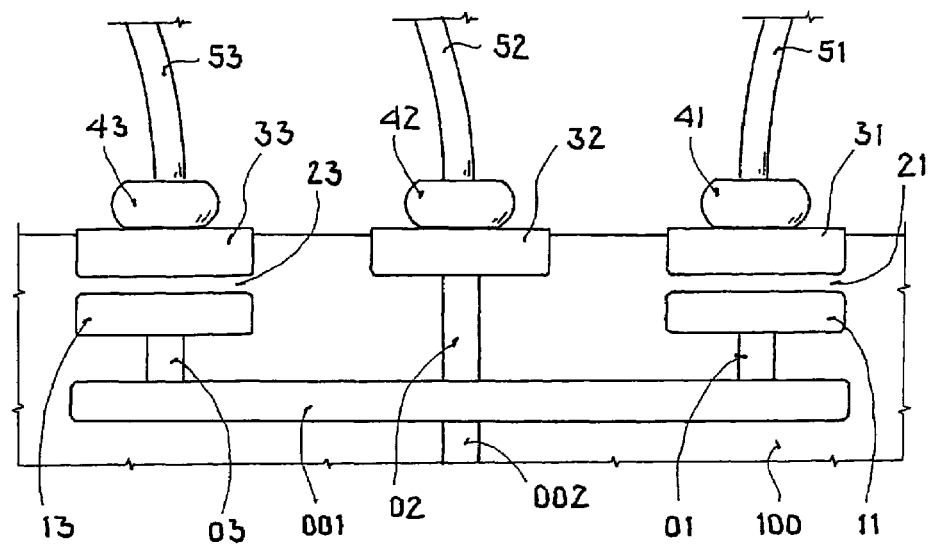
FIG. 1 is a cross-section through a terminal region of a semiconductor chip.

FIG. 1 shows a terminal of the emitter E via bond pads 31, 32, and 33 in a schematic cross-sectional view. Bond wires 51, 52, 53 with the typical bond structure 41, 42, 43 are bonded on to the respective bond pads. The bond structure 41, 42, 43 and the bond wires 51, 52, 53 each act as an inductance here. In addition, the bond structure 41, 42, 43 as well as the bond wires 51, 52, 53 each have an ohmic resistance.

The middle bond pad 32 of the bond pads 31, 32, 33 shown in FIG. 1 is connected to the emitter E of the high-frequency transistor Q1 (see FIG. 2) in an electrically conductive manner by metal connections 02, 001 and 002, which have aluminum, for example, wherein the metal connections 02, 001, and 002 have a low resistance value.

The bond pad 31 on the right is separated from an electrically conductive region 11 by a dielectric 21. In this example embodiment, the dielectric 21 has silicon dioxide, but can, for example, also be made of borosilicate glass. In this example embodiment, the electrically conductive region 11 has a metal, preferably the metal used in the wiring level 001, for example aluminum. The conductive region 11 is connected to the emitter E through the metal connections 01, 001 and 002. Naturally, additional metal connections not shown in FIG. 1 may also be necessary.

The left-hand bond pad 33 is wired in a manner analogous to the right-hand bond pad 31. In contrast to the right-hand bond pad 31 of FIG. 1, the left-hand bond pad 33 has a smaller area of overlap with a conductive region 13, so that it likewise forms a capacitance, but with a different value, presupposing that the dielectrics 21 and 23 do not compensate for the difference in areas of overlap. The manufacturing tolerance of the dielectric thickness can preferably be compensated for by different capacitances. The left-hand conductive region 13 is also connected to the emitter E by metal connections 03, 001, 002.

Figure 3A:
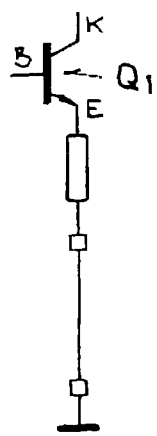
FIGS. 3a through 3c show examples of various emitter circuits.
Figure 3C:
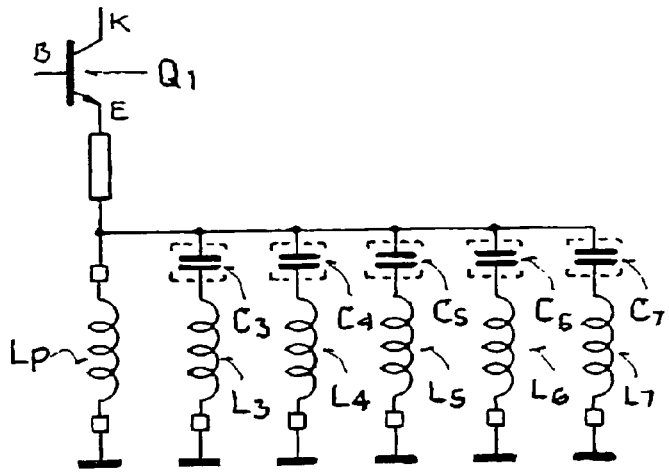
Figure 3B:
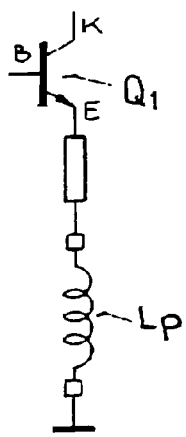

FIGS. 3a, 3b, and 3c show different types of connections to the emitter E. FIG. 3a shows the idealized connection with a bond wire having no reactance, which represents only a comparison value and cannot be implemented technically. FIG. 3b shows the connection through a bond wire which forms a parasitic inductance Lp of 0.1 nH.

An example embodiment of the invention is shown in FIG. 3c. While the supply line inductance represents a DC path for supplying the device to be contacted, the device to be contacted is preferably connected in an essentially reactance-free manner through a series-resonant circuit connected in parallel to the line inductance, with reduced reactance at the resonant frequency of said series-resonant circuit.

In the example embodiment in FIG. 3c, five damped resonant circuits formed of the capacitances C3, C4, C5, C6, and C7 and the associated inductances L3, L4, L5, L6, and L7, each having slightly different resonant frequencies at approximately 5 GHz, are connected in parallel to the bond inductance Lp. The ohmic resistive component of the bond wires is omitted in FIGS. 3b and 3c to simplify the representation. The capacitances C3, C4, C5, C6, and C7 have, for example, a structure analogous to FIG. 1, while the inductances L3, L4, L5, L6, and L7 are formed by bond wires 51, 52, 53.

Figure 4:
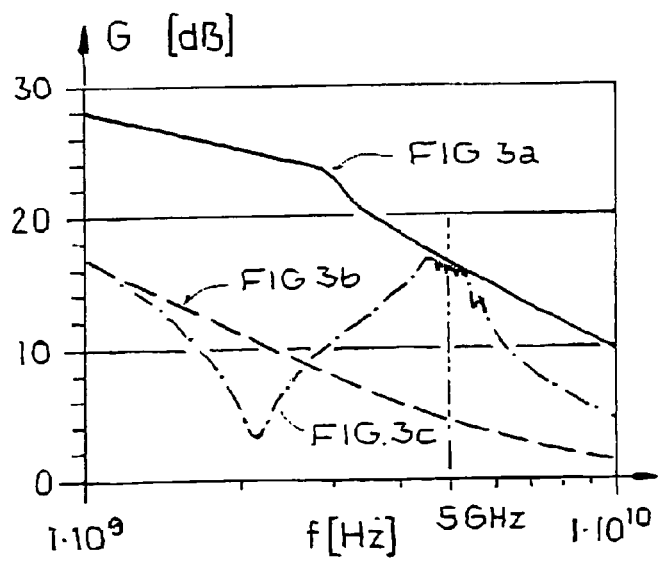
FIG. 4 is a gain-vs-frequency diagram.

FIG. 4 shows the corresponding achievable power gains. The parallel connection of the aforementioned resonant circuits to the supply line inductance increases the power gain in the example by more than an order of magnitude. In the example, the necessary resonant circuits can be implemented in an especially simple manner by capacitances located under the bond pads and having areas of $80 \times 100\ \mu m^2$, $90 \times 100\ \mu m^2$, $100 \times 100\ \mu m^2$, $110 \times 100\ \mu m^2$, and $120 \times 100\ \mu m^2$, with silicon dioxide 50 nm thick as the dielectric, and with the aforementioned bond pads as inductances.

FIG. 4 shows the gains G (dB) of the circuit variants in FIGS. 3a, 3b, and 3c plotted over frequency f (Hz). FIG. 4 shows that for the example embodiment in FIG. 3, the gain G approaches the ideal case of FIG. 3a, but only for the required operating frequency in the range of 5 GHz. As a result of the multiple parallel connection of series resonances, multiple maxima are produced in the vicinity of the operating frequency of 5 GHz, optimizing a wider frequency band with regard to the gain G (dB) than a single series resonance.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A high frequency arrangement comprising:
   an integrated high frequency circuit operating at a given operating frequency;
   a first bond pad being electrically connected by a first electrical supply line having an inductance to a housing terminal and/or another circuit, the first electrical supply line being a bond wire or a solder bump; and
   a dielectric that adjoins the first bond pad so that the first bond pad forms a first capacitance with the dielectric and an electrically conductive region of the integrated high-frequency circuit, wherein the first capacitance and the first supply line provide a first resonant frequency associated with the high-frequency circuit at a value substantially equal to the operating frequency of the high-frequency circuit.

2. The high frequency arrangement according to claim 1, further comprising a second bond pad being electrically connected in parallel to the housing terminal and/or the additional circuit by a second supply line, the second bond pad being conductively connected to the electrically conductive region.

3. The high frequency arrangement according to claim 1, further comprising a third bond pad being electrically connected in parallel to the housing terminal and/or the additional circuit by a third supply line having an inductance, wherein the third bond pad adjoins a dielectric so that the third bond pad forms a second capacitance with the dielectric and an electrically conductive region of the integrated high-frequency circuit, and wherein the second capacitance and the third supply line provide a second resonant frequency associated with the high-frequency circuit in the vicinity of the operating frequency of the high-frequency circuit but different from the first resonant frequency.

4. The high frequency arrangement according to claim 3, further comprising additional parallel circuits formed of additional supply lines and additional bond pads adjoining dielectrics, which provide additional resonant frequencies.

5. The high frequency arrangement according to claim 3, wherein the first capacitance has a different geometry or a different surface area than the second capacitance.

6. The high frequency arrangement according to claim 1, wherein the conductive region is conductively connected to a semiconductor region of an active integrated component of the integrated high-frequency circuit or to an emitter of a high-frequency bipolar transistor or of a high-frequency tetrode.

7. The high frequency arrangement according to claim 2, wherein at least the second supply line forms a negative feedback for the integrated high frequency circuit, which is reduced for at least the first resonant frequency.

8. The high frequency arrangement according to claim 1, wherein the dielectric has silicon dioxide and has a thickness less than 100 nm.

9. The high frequency arrangement according to claim 1, wherein the conductive region has a metal.

10. A high frequency arrangement comprising:
    a high frequency circuit operating at a given operating frequency, the high frequency circuit being provided on a semiconductor chip that is connected to a housing terminal and/or an additional circuit by an electrical supply line having an inductance, the electrical supply line being a bond wire or a solder bump; and
    a series-resonant circuit being connected in parallel with the electrical supply line and providing a resonant frequency substantially equal to an operating frequency of the high-frequency circuit.

11. The high frequency arrangement according to claim 1, wherein the high frequency arrangement is provided in a radar system, a radio communications system, or a mobile telephony system.

12. The high frequency arrangement according to claim 1, wherein the dielectric has silicon dioxide and has a thickness less than 50 nm.

* * * * *